(12) United States Patent
Weingarten et al.

(10) Patent No.: US 9,195,592 B1
(45) Date of Patent: Nov. 24, 2015

(54) ADVANCED MANAGEMENT OF A NON-VOLATILE MEMORY

(71) Applicant: DENSBITS TECHNOLOGIES LTD., Haifa (IL)

(72) Inventors: Hanan Weingarten, Herzelia (IL); Igal Maly, Tel Aviv (IL); Avigdor Segal, Netanya (IL)

(73) Assignee: DENSBITS TECHNOLOGIES LTD., Haifa (IL)

( * ) Notice: Subject to any disclaimer, the term of this patent is extended or adjusted under 35 U.S.C. 154(b) by 196 days.

(21) Appl. No.: 14/097,086

(22) Filed: Dec. 4, 2013

Related U.S. Application Data

(63) Continuation-in-part of application No. 13/859,497, filed on Apr. 9, 2013, which is a continuation of application No. 13/434,083, filed on Mar. 29, 2012, now Pat. No. 8,996,790.

(60) Provisional application No. 61/485,397, filed on May 12, 2011.

(51) Int. Cl.
*G06F 12/02* (2006.01)
*G06F 12/12* (2006.01)
*G06F 12/10* (2006.01)

(52) U.S. Cl.
CPC ........ *G06F 12/0246* (2013.01); *G06F 12/1009* (2013.01); *G06F 12/123* (2013.01)

(58) Field of Classification Search
CPC ............ G06F 11/1008; G06F 11/1076; G06F 12/0646; G06F 12/10; G06F 12/1433; G06F 21/78; G06F 2212/1016; G06F 2212/2022
See application file for complete search history.

(56) References Cited

U.S. PATENT DOCUMENTS

| | | |
|---|---|---|
| 4,430,701 A | 2/1984 | Christian et al. |
| 4,463,375 A | 7/1984 | Macovski |
| 4,584,686 A | 4/1986 | Fritze |
| 4,589,084 A | 5/1986 | Fling et al. |
| 4,777,589 A | 10/1988 | Boettner et al. |
| 4,866,716 A | 9/1989 | Weng |
| 5,003,597 A | 3/1991 | Merkle |
| 5,077,737 A | 12/1991 | Leger et al. |
| 5,297,153 A | 3/1994 | Baggen et al. |
| 5,305,276 A | 4/1994 | Uenoyama |
| 5,592,641 A | 1/1997 | Doyle et al. |
| 5,623,620 A | 4/1997 | Alexis et al. |
| 5,640,529 A | 6/1997 | Hasbun |
| 5,657,332 A | 8/1997 | Auclair et al. |
| 5,663,901 A | 9/1997 | Harari et al. |
| 5,724,538 A | 3/1998 | Morris et al. |

(Continued)

OTHER PUBLICATIONS

Search Report of PCT Patent Application WO 2009/118720 A3, Mar. 4, 2010.

(Continued)

*Primary Examiner* — Yong Choe
(74) *Attorney, Agent, or Firm* — Dentons US LLP

(57) ABSTRACT

A method of managing a non-volatile memory module, the method may include: allocating, by a memory controller, logically erased physical blocks of a non-volatile memory module to a spare block pool; allocating, by the memory controller, physical blocks from the spare block pool to become buffer blocks of a buffer of the non-volatile memory module; and controlling, by the memory controller, a utilization of the buffer blocks of the buffer by applying a page based buffer management scheme.

27 Claims, 6 Drawing Sheets

(56) References Cited

U.S. PATENT DOCUMENTS

| | | |
|---|---|---|
| 5,729,490 A | 3/1998 | Calligaro et al. |
| 5,740,395 A | 4/1998 | Wells et al. |
| 5,745,418 A | 4/1998 | Hu et al. |
| 5,778,430 A | 7/1998 | Ish et al. |
| 5,793,774 A | 8/1998 | Usui et al. |
| 5,920,578 A | 7/1999 | Zook |
| 5,926,409 A | 7/1999 | Engh et al. |
| 5,933,368 A | 8/1999 | Hu et al. |
| 5,956,268 A | 9/1999 | Lee |
| 5,956,473 A | 9/1999 | Hu et al. |
| 5,968,198 A | 10/1999 | Hassan et al. |
| 5,982,659 A | 11/1999 | Irrinki et al. |
| 6,011,741 A | 1/2000 | Harari et al. |
| 6,016,275 A | 1/2000 | Han |
| 6,038,634 A | 3/2000 | Ji et al. |
| 6,081,878 A | 6/2000 | Estakhri et al. |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park et al |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett et al. |
| 7,388,781 B2 | 6/2008 | Litsyn et al. |
| 7,395,404 B2 | 7/2008 | Gorobets et al. |
| 7,441,067 B2 | 10/2008 | Gorobets et al. |
| 7,443,729 B2 | 10/2008 | Li et al. |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell et al. |
| 7,619,922 B2 | 11/2009 | Li et al. |
| 7,697,326 B2 | 4/2010 | Sommer et al. |
| 7,706,182 B2 | 4/2010 | Shalvi et al. |
| 7,716,538 B2 | 5/2010 | Gonzalez et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun et al. |
| 7,961,797 B1 | 6/2011 | Yang et al. |
| 7,975,192 B2 | 7/2011 | Sommer et al. |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang et al. |
| 8,250,324 B2 | 8/2012 | Haas et al. |
| 8,300,823 B2 | 10/2012 | Bojinov et al. |
| 8,305,812 B2 | 11/2012 | Levy et al. |
| 8,327,246 B2 | 12/2012 | Weingarten et al. |
| 8,407,560 B2 | 3/2013 | Ordentlich et al. |
| 8,417,893 B2 | 4/2013 | Khmelnitsky et al. |
| 2001/0034815 A1 | 10/2001 | Dugan et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2002/0156988 A1 | 10/2002 | Toyama et al. |
| 2002/0174156 A1 | 11/2002 | Birru et al. |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Lee et al. |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0059768 A1 | 3/2004 | Denk et al. |
| 2004/0080985 A1 | 4/2004 | Chang et al. |
| 2004/0153722 A1 | 8/2004 | Lee |
| 2004/0153817 A1 | 8/2004 | Norman et al. |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0195651 A1 | 8/2006 | Estakhri et al. |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |

(56) References Cited

U.S. PATENT DOCUMENTS

| | | |
|---|---|---|
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov et al. |
| 2008/0158958 A1 | 7/2008 | Sokolov et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0027961 A1 | 1/2009 | Park et al. |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn |
| 2009/0132755 A1 | 5/2009 | Radke |
| 2009/0144598 A1 | 6/2009 | Yoon et al. |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi et al. |
| 2009/0287930 A1 | 11/2009 | Nagaraja |
| 2009/0300269 A1 | 12/2009 | Radke et al. |
| 2009/0323942 A1 | 12/2009 | Sharon et al. |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto et al. |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette et al. |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang et al. |
| 2011/0209028 A1 | 8/2011 | Post et al. |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |

(56) References Cited

U.S. PATENT DOCUMENTS

2012/0124273 A1  5/2012  Goss et al.
2012/0246391 A1  9/2012  Meir et al.

OTHER PUBLICATIONS

Search Report of PCT Patent Application WO 2009/095902 A3, Mar. 4, 2010.
Search Report of PCT Patent Application WO 2009/078006 A3, Mar. 4, 2010.
Search Report of PCT Patent Application WO 2009/074979 A3, Mar. 4, 2010.
Search Report of PCT Patent Application WO 2009/074978 A3, Mar. 4, 2010.
Search Report of PCT Patent Application WO 2009/072105 A3, Mar. 4, 2010.
Search Report of PCT Patent Application WO 2009/072104 A3, Mar. 4, 2010.
Search Report of PCT Patent Application WO 2009/072103 A3, Mar. 4, 2010.
Search Report of PCT Patent Application WO 2009/072102 A3, Mar. 4, 2010.
Search Report of PCT Patent Application WO 2009/072101 A3, Mar. 4, 2010.
Search Report of PCT Patent Application WO 2009/072100 A3, Mar. 4, 2010.
Search Report of PCT Patent Application WO 2009/053963 A3, Mar. 4, 2010.
Search Report of PCT Patent Application WO 2009/053962 A3, Mar. 4, 2010.
Search Report of PCT Patent Application WO 2009/053961 A3, Mar. 4, 2010.
Search Report of PCT Patent Application WO 2009/037697 A3, Mar. 4, 2010.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-72 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com), Oct. 2005.
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", IEEE Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1, Feb. 2005.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. J Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com , 2005.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26, Dec. 2007.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

| Logical Address 111 | Physical Address 112 | Logically Erased 113 |
|---|---|---|
| 0 | 122 | YES |
| 1 | NONE | YES |
| 2 | 264 | NO |
| 3 | 313 | NO |
| ... | ... | ... |
|  |  |  |
|  |  |  |
|  |  |  |
|  |  |  |
| N |  |  |

100(1) - 100(N)

Mapped Entry

Unmapped Entry

ADVANCED MANAGEMENT OF A NON-VOLATILE MEMORY

CROSS REFERENCE TO RELATED APPLICATIONS

This application is a continuation in part of U.S. patent application Ser. No. 13/859,497 filing date Apr. 9, 2013 titled "ADVANCED MANAGEMENT OF A NON-VOLATILE MEMORY" which is a continuation in part of U.S. patent application Ser. No. 13/434,083, filing date Mar. 29, 2012, titled "SYSTEM AND METHOD FOR FLASH MEMORY MANAGEMENT", which claims priority from U.S. provisional patent Ser. No. 61/485,397 filing date May 12, 2011, all applications are incorporated herein by reference.

BACKGROUND

Flash memory devices store information with high density on Flash cells with ever smaller dimensions. In addition, Multi-Level Cells (MLC) store several bits per cell by setting the amount of charge in a cell. Flash memory devices are organized into (physical) pages. Each page includes a section allocated for data (512 bytes-16 Kbytes and expected larger in the future) and a small amount of spare bytes (64-1 Kbytes or more bytes for every page) for storing redundancy and metadata. The redundancy bytes are used to store error correcting information, for correcting errors which may have occurred during flash lifetime and the page read process. Each program operation is performed on an entire page. A number of pages are grouped together to form an Erase Block (erase block). A page cannot be erased unless the entire erase block which contains it is erased.

One common application of flash memory devices is Secure Digital (SD) cards and embedded Multi-Media Cards (eMMC). An embedded flash memory storage device (like eMMC card) may typically contain flash memory devices and a flash memory controller. The memory controller translates commands coming in through the host interface into actions (Read/Write/Erase) on the flash memory devices. The most common commands for memory storage device may be Read and Write commands of one or more sectors, where a sector may be, but is not limited to, a sequence of 512 bytes. The Read or Write commands may be of a single sector or multiple sectors. These commands may refer to logical addresses. These addresses may then be redirected to new addresses on the flash memory which need not directly correspond to the logical addresses that might be referenced by the Read or Write commands. This is due to memory management that may be carried out by the flash memory controller in order to support several features such as wear-leveling, bad block management, firmware code and data, error-correction, and others. The erase function is performed on an entire erase block. Because of this functionality, before the data of a certain block may be replaced such as during a write function, the new data must be written in an alternative location before an erase can occur, to preserve the integrity of the stored data.

Due to the small dimensions of a typical SD or eMMC card and the price limitations, the memory controller may typically have only a small RAM available for storage. The small size of the RAM memory limits the type of memory management which may be carried out by the memory controller with regard to the data stored in the flash memory device and received from the interface.

The memory controller may typically manage the memory at the erase block level, because managing data of small particle sizes becomes difficult. That is, the logical memory space may be divided into units of memory contained within a single erase block or some constant multiple of erase blocks, such that all logical sector addresses within each said unit of memory may be mapped to the same erase block or some constant multiple thereof.

This type of management has the drawback that for writing random access data sectors to memory or other memory units smaller than an erase block, erase blocks must be frequently rewritten. Because of the characteristics of flash memory, each new piece of information is written into an empty page. In flash memory a page may not be rewritten before the entire erase block is erased first.

If a portion of the memory unit contained within an erase block may need to be rewritten, it is first written into a freshly allocated erased erase block. The remaining, unmodified, contents of the erase block may then be copied into the new erase block and the former erase-block may be declared as free and may be further erased. This operation may be referred to as "sealing" or "merging". The operation involves collecting the most recent data of a logical block and then merging it with the rest of the block data in a single erase block. Thus, even if a single sector from an erase block is rewritten, a complete erase block would be rewritten.

This may result in causing a significant degradation in the average write speed. It may also impose a significant delay in the response time between random write sector operations. It also may cause excessive P/E (program/erase) cycling, which may be problematic in new generations of flash memory devices where the number of P/E cycles is limited to a few thousand or even a few hundreds.

The memory controller is used to manage the overhead described above, and must always keep track of the data associated with each logical address and the actual memory location. This is usually achieved by implementing a mapping method between the logical address space assigned to the data and the actual memory storage location of the data.

Several methods may be implemented to execute such a mapping. Two approaches implement mapping systems that rely on block mapping and page mapping, respectively. In an approach using block mapping (block based management), each physical block in the flash memory is mapped to a contiguous logical memory block of the same data size (LMBA). In this approach when one page in some logical block is updated, the entire associated physical block must be copied to a fresh block, and the new data must be written in place of the obsolete copy. A merge may be an operation where the original content of a logical block is merged with the new data to form a new up to date copy of the block. This up to date copy is the data block that is associated with a logical data block assigned to the data contained within. In the second approach, each logical page (usually but not necessary 4 KB of data) of a logical block is mapped to an arbitrary physical page where two pages belonging to the same logical block can reside in different physical blocks of the flash memory. The second approach (page based management) requires additional complexity in terms of the amount of management data and memory overhead required for the physical memory to logical address mapping tables. For memory applications where severe limitations exist on available control memory, this approach is less appropriate. Flash memories such as SD or eMMC have limited amount of memory overhead and the first mapping approach, or variants thereof are more practical.

In order to be able to benefit from the advantages of both aforementioned flash management approaches, embedded device can manage main part of the device capacity in a block based manner, while managing a smaller portion in a page based manner. Such approach allows to keep most of the device capacity (according to the size allocated for the device user/host) mapped with rather compact tables, translating logical address of a large contiguous span of memory to a physical location (logical to physical blocks mapping), therefore using less RAM memory, and minimizing the need to access flash for storing and loading such tables or their derivatives. In parallel such approach (page based random data cache portion) allows overcoming problems relevant to writing of random traffic as described above (performance degradation, delay in response time, excessive P/E cycling etc.). Typically some sort of cleaning algorithms should be applied constantly or from time to time in order to vacate data from the random data cache or move data in the cache and free space available for further absorbing random data. Efficiency of cleaning algorithms, capacity available for caching random data (overprovisioning) and the efficiency of the random write operations determines the random write performance of the device.

Overprovisioning—usually there's a difference between the physical flash capacity used by the device and the logical capacity available for the device user. This difference allows the memory controller to use some of the device capacity for internal management needs. Overprovisioning in embedded flash memory storage systems is typically defined statically and doesn't change over system's lifetime.

Overprovisioning influences Random Write performance—one of the purposes of the capacity not allocated for the user (overprovisioning) is to allow caching of random write traffic (short, non-sequential write transactions). Increase in overprovisioning capacity typically will result in Random Write performance improvement due to ability to perform cleaning of the cached (page based) data to block based mapped data less frequently.

Another host interface command that can be exploited by the flash memory storage system is a logical erase operation, usually called "Trim". In this command the host provides the flash memory controller logical address space which was typically previously written by the host and the user data in it is no longer required. This logical address range is declared as logically erased and storing no valid user data.

The invention suggests that partially written user space (unused since the device life start or trimmed by the device user or available due to changing redundancy rate, to handle different reliability requirements over device lifetime) can free additional temporary overprovisioning.

Some of the data in a typical flash memory device may be stored in a single cell manner (SLC) in order to increase the performance or the reliability of the stored information. E.g. metadata (system control information/mapping tables etc.), enhanced storage partition, random data caches etc.

Typical flash memory device memory controller needs to account for the free blocks available in the system (spare blocks). Such blocks may be signed by some software indication or managed in some software database. Collection of all or part (distinguished according to some trait) of spare blocks in the system can be regarded as "spare blocks pool" (list of such blocks). MLC/TLC devices may need to distinguish MLC spare blocks from SLC spare blocks and manage several pools of spare blocks of different types. E.g. SLC blocks may need to reach a much higher cycling than the MLC blocks.

SUMMARY

According to an embodiment of the invention there may be provided a method of managing a non-volatile memory module, the method may include allocating, by a memory controller, logically erased physical blocks of a non-volatile memory module to a spare block pool; allocating, by the memory controller, physical blocks from the spare block pool to become buffer blocks of a buffer of the non-volatile memory module; and controlling, by the memory controller, a utilization of the buffer blocks of the buffer by applying a page based buffer management scheme.

The allocating of the logically erased physical blocks may include initially allocating a predefined number of physical blocks to the spare block pool; and the method may include allocating to the spare block pool additional logically erased physical blocks.

The controlling of the utilization of the buffer blocks may include controlling cleaning operations in response to a status of the buffer.

The method may include controlling, by the memory controller, a utilization of a memory section of the non-volatile memory module that differs from the buffer by applying a block based buffer management scheme.

The method may include managing a logical block to physical block mapping data structure that maps logical blocks to mapped physical blocks.

The method may include receiving data sectors to be written to the non-volatile memory module and determining whether to write the data sectors to the buffer or to a mapped physical block.

The determining may be responsive to a state of the buffer.

The logically erased physical blocks allocated to the spare block pool may include all or only part of all of logically erased physical blocks of the non-volatile memory module.

The method may include allocating the logically erased physical blocks to multiple spare block pools, wherein different spare block pools are associated with different types of programming, wherein different types of programming differ from each other by a number of logical bits programmed per flash memory cell (for example—SLC, MLC); and allocating, by the memory controller, physical blocks from the multiple spare block pools to become buffer blocks of the buffer of the non-volatile memory module.

The allocating of the physical blocks from the multiple spare block pools may be followed by independently managing the multiple spare block pools.

The method may include allocating, by the memory controller, physical blocks that have become buffer blocks of a buffer of the non-volatile memory module to a sequential portion of the non-volatile memory module.

The method may include allocating, by the memory controller, physical blocks from the spare block pool to a sequential portion of the non-volatile memory module.

According to an embodiment of the invention there may be provided a non-transitory computer readable medium that stores instructions that once executed by a memory controller may cause the memory controller to allocate logically erased physical blocks of a non-volatile memory module to a spare block pool; allocate physical blocks from the spare block pool to become buffer blocks of a buffer of the non-volatile memory module; and control a utilization of the buffer blocks of the buffer by applying a page based buffer management scheme.

The non-transitory computer readable medium may store instructions that once executed by a memory controller may cause the memory controller to initially allocate a predefined number of physical blocks to the spare block pool; and further allocate to the spare block pool additional logically erased physical blocks.

The non-transitory computer readable medium may store instructions that once executed by a memory controller may cause the memory controller to control cleaning operations in response to a status of the buffer.

The non-transitory computer readable medium may store instructions that once executed by a memory controller may cause the memory controller to control a utilization of a memory section of the non-volatile memory module that differs from the buffer by applying a block based buffer management scheme.

The non-transitory computer readable medium may store instructions that once executed by a memory controller may cause the memory controller to manage a logical block to physical block mapping data structure that maps logical blocks to mapped physical blocks.

The non-transitory computer readable medium may store instructions that once executed by a memory controller may cause the memory controller to receive data sectors to be written to the non-volatile memory module and determine whether to write the data sectors to the buffer or to a mapped physical block.

The non-transitory computer readable medium may store instructions that once executed by a memory controller may cause the memory controller to determine in response to a state of the buffer.

The logically erased physical blocks allocated to the spare block pool may include all or only part of all of logically erased physical blocks of the non-volatile memory module.

The non-transitory computer readable medium may store instructions that once executed by a memory controller may cause the memory controller to allocate the logically erased physical blocks to multiple spare block pools, wherein different spare block pools are associated with different types of programming, wherein different types of programming differ from each other by a number of logical bits programmed per flash memory cell (for example—SLC, MLC); and allocate, by the memory controller, physical blocks from the multiple spare block pools to become buffer blocks of the buffer of the non-volatile memory module.

The allocating of the physical blocks from the multiple spare block pools may be followed by independently managing the multiple spare block pools.

The non-transitory computer readable medium may store instructions that once executed by a memory controller may cause the memory controller to allocate, by the memory controller, physical blocks that have become buffer blocks of a buffer of the non-volatile memory module to a sequential portion of the non-volatile memory module.

According to an embodiment of the invention there may be provided a memory controller that may include an allocation circuit that may be arranged to allocate logically erased physical blocks of a non-volatile memory module to a spare block pool and to allocate physical blocks from the spare block pool to become buffer blocks of a buffer of the non-volatile memory module; and a buffer memory controller that may be arranged to control a utilization of the buffer blocks of the buffer by applying a page based buffer management scheme.

The allocation circuit may be arranged to initially allocate a predefined number of physical blocks to the spare block pool; and further allocate to the spare block pool additional logically erased physical blocks.

The buffer memory controller may be arranged to control cleaning operations in response to a status of the buffer.

The memory controller may include a block control circuit that may be arranged to control a utilization of a memory section of the non-volatile memory module that differs from the buffer by applying a block based buffer management scheme.

The memory controller may be arranged to manage a logical block to physical block mapping data structure that maps logical blocks to mapped physical blocks.

The memory controller may include an interface that may be arranged to receive data sectors to be written to the non-volatile memory module and wherein the memory controller may be arranged to determine whether to write the data sectors to the buffer of to a mapped physical block.

The determining may be responsive to a state of the buffer.

The logically erased physical blocks allocated to the spare block pool may include all or only part of all of logically erased physical blocks of the non-volatile memory module.

The memory controller may be arranged to allocate the logically erased physical blocks to multiple spare block pools, wherein different spare block pools are associated with different types of programming, wherein different types of programming differ from each other by a number of logical bits programmed per flash memory cell (for example—SLC, MLC); and allocate physical blocks from the multiple spare block pools to become buffer blocks of the buffer of the non-volatile memory module.

The allocating of the physical blocks from the multiple spare block pools may be followed by independently managing the multiple spare block pools.

The memory controller may be arranged to allocate physical blocks that have become buffer blocks of a buffer of the non-volatile memory module to a sequential portion of the non-volatile memory module.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 2 illustrates data structures according to an embodiment of the invention;

Figure 1:
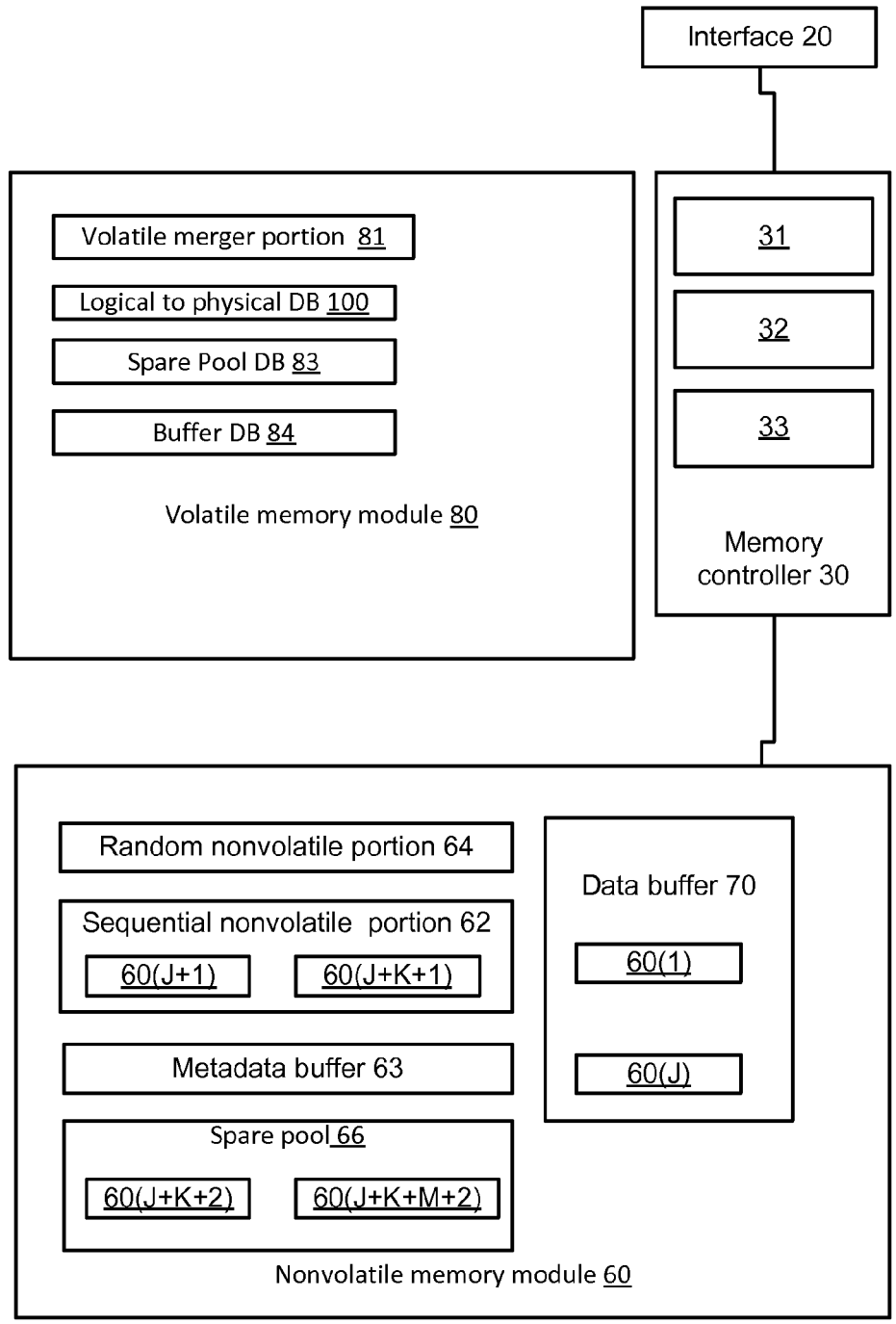
FIG. 1 illustrates a system according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

The invention describes methods, systems and computer readable media for dynamically increasing embedded flash storage device overprovisioning and as a result increasing the random write performance on the account of unclaimed user space.

FIG. 1 illustrates a system 10 according to embodiments of the invention. System 10 includes an interface 20 that may be linked to a memory controller 30 and may be also linked to a nonvolatile memory module 60 and a volatile memory module 80.

The nonvolatile memory module 60 may include the random portion 64, a sequential portion 62, a data buffer 70 and a metadata buffer 63.

The random portion 64 may refer to a logically allocated random portion memory, while the sequential portion may refer to a logically allocated sequential portion memory. The metadata buffer 63 and other management portions may be allocated within the nonvolatile memory module 60. In FIG. 1 some data structures such as the metadata buffer 63 may be illustrated as being contained outside the random portion 64 or sequential portion 62, although these structures may be contained within nonvolatile memory. It is noted that the data buffer 70 may be included in the random portion 64.

System 10 may store one or more management data structures that may store metadata about the content of the volatile memory module 80, the content of the nonvolatile memory module 60 or both memory modules. The management data structure can be stored at the volatile memory module 80 and, additionally or alternatively at the nonvolatile memory module 60.

FIG. 1 illustrates volatile memory module 80 and metadata buffer 63 as storing management data structures such as logical to physical data base 100, spare pool data base 83 and buffer database 84.

FIG. 1 also illustrates a volatile merger portion 81 that can be used when data sectors are merged. Data sectors that were previously stored at the random portion can be merged before being written to the sequential portion. Additionally or alternatively, the merging can occur between data sectors from sequential and random portions. The merging may include copying data sectors to be merged to volatile merger portion 81 and then writing the merged data sectors to the sequential portion.

The non-volatile memory module 60 includes multiple physical blocks. These physicla blocks can be allocated to data buffer 70 (see J physical blocks 60(1)-60(J)), to sequential nonvolatile portion 62 (see K physical blocks 60(J+1)-60(J+1+K)) to random nonvolatile portion 54 (such blocks are not shown for brevity of explanation) and to spare pool 66 (see M physical blocks 60(J+K+2)-60(J+K+M+2)).

The memory controller 30 may include multiple cirucits such as:

a. Allocation circuit 31 that is arranged to allocate logically erased physical blocks of a non-volatile memory module 60 to a spare block pool 66 and to allocate physical blocks from the spare block pool 66 to become buffer blocks of a buffer 70 of the non-volatile memory module.

b. Buffer memory controller 30 32 that is arranged to control a utilization of the buffer blocks (60(1)-60(J)) of the buffer 70 by applying a page based buffer management scheme.

c. Block control circuit 33 that is arranged to control a utilization of a memory section (such as random non-volatile portion 64 and/or sequential nonvolatile portion 62) of the non-volatile memory module that differs from the buffer by applying a block based buffer management scheme.

Figure 5:
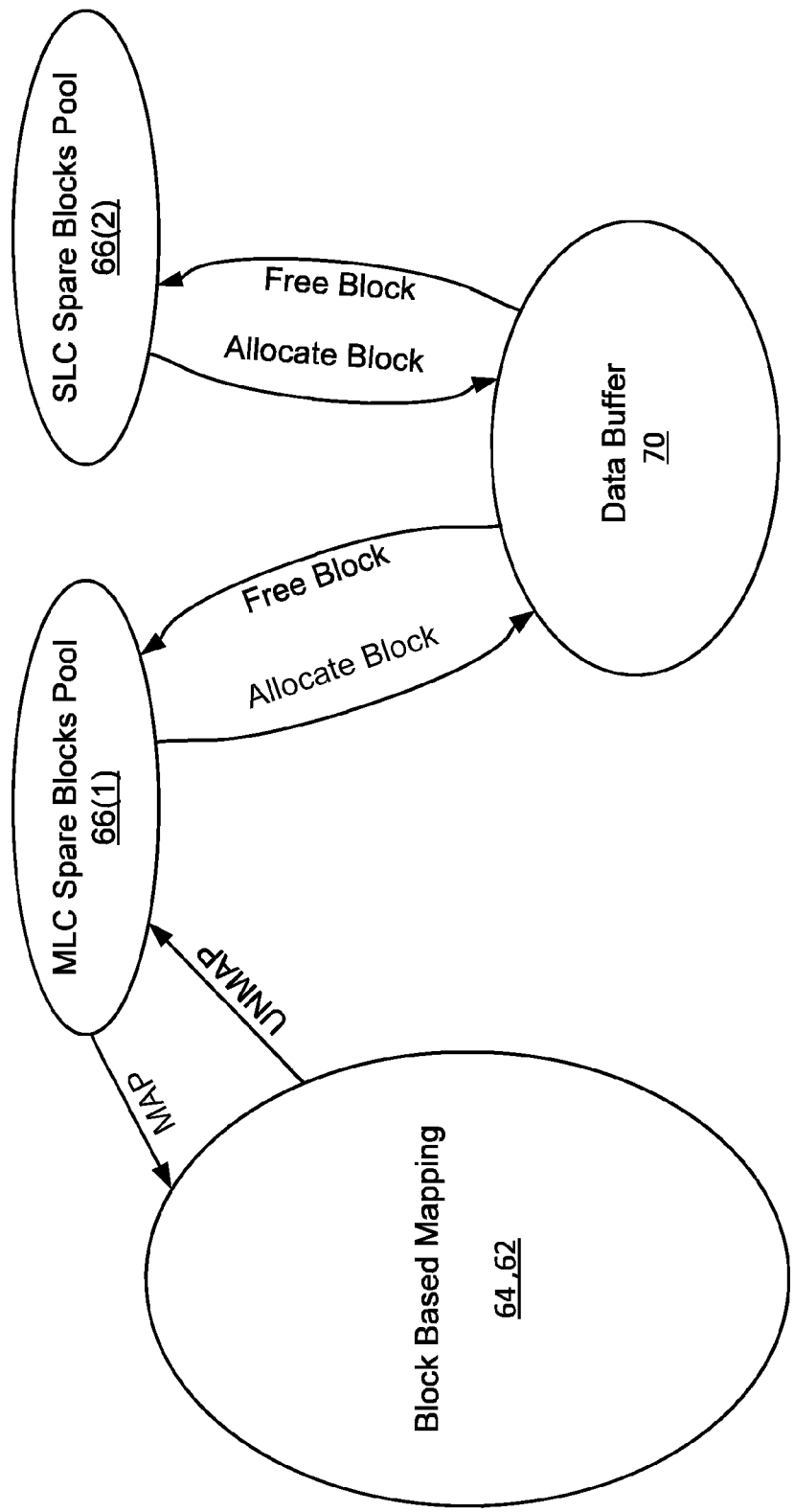
FIG. 5 illustrates allocations of physical blocks between various entities method according to an embodiment of the invention.

The spare pool 66 can include multiple separate spare pools—one per type of programming. FIG. 5 illustrates the spare pool 66 as including MLC and SLC spare pools 66(1) and 66(2). FIG. 5 illustrates the allocation of blocks and their change of allocation between data buffer 70, a block based mapping non-volatile memory space (that may include sequential and/or random nonvolatile portions 62 and 64), MLC spare blocks pool 66(1) and MLC spare blocks pool 66(2).

Random write performance can be significantly improved by allocating some of the block-level mapped user-data blocks which are not in use (since start of life or after logical space trim operation or due to changing redundancy rate) to be used for page-level mapped random data absorption (overprovisioning for random data).

A predefined part of the storage device capacity is usually allocated for page based data caching, which among other things absorbs random write transactions.

Part of the user capacity which is not exploited by the user for data storing at any given time may be used to temporarily increase the overprovisioning part and therefore increase the random write performance.

There may be provided methods, systems and computer readable media for allocating unused part of the user space as overprovisioning and freeing it in time to allow the user to exploit full user capacity whenever needed.

There may be provided methods, systems and computer readable media for achieving the above for a system using separate pools/lists of spare blocks (e.g. for different block types) for user data storing and for the random data cache.

Terminology

MLC—multi level cell (device or block in a device), relates to the ability to store several bits of data in a single memory cell. For example relates to 2-bits per cell and 3-bits per cell devices in the same manner (without loss of generality).

L2P mapping—translation from logical (user/host/virtual) address space to physical address space of the device (e.g. translation from logical flash block address to a physical one).

L2P blocks mapping—translation from logical flash block address (aligned to flash block size or some other contiguous mapping unit) to corresponding physical/semi-physical address, usually consisting of one or several flash blocks.

Logical memory block address (LMBA)—user address space unit, mapped by L2P blocks mapping, typically corresponds in size to one or several flash blocks (aligned to such unit start and size).

Physical memory block address (PMBA)—physical/semi-physical flash address unit used in L2P blocks mapping, typically in the size of LMBA, which typically corresponds to one or several flash blocks.

Spare block—free physical block not holding any valid data, which is available for memory controller 30 utilization. Memory controller 30 can allocate such block for storing information to it when needed.

Native overprovisioning—the difference between the memory capacity available for the user and the actual capacity of the total flash memory available for the memory controller 30 usage. Typically exploited by the memory controller 30 for internal management (storing control information, data caching etc.).

Mapped logical block—entry in L2P blocks mapping table, associated with some Physical block address. The Logical block corresponding user space may or may not contain user data (may be erased/unwritten).

Unmapped logical block—free entry in L2P blocks mapping table corresponding to logically erased/unwritten Logical block address (e.g. logical address space mapped to a flash block) which is not associated with any Physical block address.

Block mapping—the act of associating an unmapped logical block to a Physical memory block address.

Cleaning—any algorithm for vacating data from the buffer absorbing the random writes traffic or moving data within random data cache buffer or any other method for freeing space in such buffer. E.g. moving random data from page based managed portion of the device memory to the block based managed portion.

To support variable over-provisioning the memory controller 30 supports unmapped logical blocks. E.g. by mapping logical blocks to invalid physical location. Such logical block is naturally logically erased (holds no user/host data). However the random data absorbing buffer may hold user data which is mapped to the address space of logical block which is not mapped to a physical block. In that case the logical address space of that logical block is considered partly written. The memory controller 30 can support unmapped logical blocks for the entire logical blocks span or any subset of such blocks. The memory controller 30 should support all required operations on logically erased block while it is unmapped (e.g. reading erased data)

The memory controller 30 should support mapping an unmapped block. I.e. associating unmapped logical block address with a physical memory block acquired from a list (pool) of spare blocks.

The memory controller 30 should support un-mapping a mapped block. I.e. freeing unused physical memory block associated with a logical block address into a of spare blocks list/pool (signing it as spare).

The memory controller 30 should support treating logically erased blocks (some or all of them) as spare blocks, e.g. by un-mapping all or part of the logically erased blocks and signing them as part of the spare blocks pool. Associating logically erased blocks with spare blocks pool can be either ongoing (e.g. instantly sign a block as spare as soon as it's being logically erased) or performed once in a while. E.g. always keep count of mapped and erased blocks and scan such blocks in order to sign some of them as spare when spare blocks pool runs out of available blocks.

FIG. 2 illustrates a logical to physical data base 100 according to an embodiment of the invention. The logical to physical data base 100 includes multiple (N) entries 100(1)-100(N) and three columns—thereby each entry has three fields corresponding to (a) a logical address 111 of a logical block, (b) a physical address 112 of a physical block—if such a physical block is mapped to the logical block, a NONE value if such a physical block is not mapped to the logical block and (c) a logical erased flag indicative of whether the physical block is logically erased or not.

The four entries of the logical to physical data base 100 start by a first logically erased and mapped physical block <0, 122, YES>, a second unmapped and logically erased physical block <1, NONE, YES>, and two non-logically erased and mapped physical blocks <2, 264, NO>, and <3, 313, NO>.

Total overprovisioning at any given moment is determined by the amount of the native overprovisioning and the amount of unused user space (or some part of it that the memory controller 30 is able to exploit).

The memory controller 30 should be able to perform cleaning algorithms according to the available overprovisioning. E.g. dynamically adjusting the rate of the cleaning process to the amount of available spare blocks.

Cleaning algorithms of the buffer absorbing random write transactions (e.g. page based portion of the device memory) should take into account the extra space available due to increased effective overprovisioning and achieve improved performance accordingly.

Physical blocks not associated with any logical block can be signed as spare blocks. The total amount of spare space at any moment is determined by the total overprovisioning which is not being exploited to hold valid data.

When host first writes to an unmapped block address, while in a normal system state (not during cleaning or under regular cleaning policy), the memory controller 30 can perform mapping of such logical address with a physical block, thus consuming (removing) an appropriate block from the spare blocks pool.

If the memory controller 30 performs blocks mapping as soon as the host claims the logical address space (as described in previous paragraph), cleaning algorithms vacating data to block based managed memory should only vacate data with logical addresses corresponding to mapped blocks. Therefore, cleaning process should not consume additional blocks from spares blocks pool for the sake of mapping.

Otherwise, cleaning algorithm should account for the spare blocks which will be consumed for the sake of mapping as a result of the cleaning process If the system is in a critical state which requires immediate freeing of overprovisioning space (e.g. random writes buffer runs out of available space and spare blocks amount has to be increased), rigorous cleaning will be typically applied. During such state, mapping due to traffic from host to unmapped addresses, should be temporary avoided.

If mapping process was stopped for some reason (e.g. cleaning during critical system state), it should be resumed when mapping avoiding policy is over (it is assumed overprovisioning was freed while in such process). E.g. all incoming traffic to unmapped addresses, during the period in which mapping was not performed, can be mapped as soon as this policy is over.

When traffic is incoming to an unmapped logical address, during stage in which mapping is not allowed (e.g. critical state cleaning is performed to free some spare blocks), the traffic should be routed to the random transactions buffer until mapping is permitted again. It is assumed random traffic buffer applies cleaning algorithms in a manner that allows safely absorbing incoming data until enough space is freed.

In a system in which there's significance for keeping separate the blocks for random data buffer and the regular block-based-managed disk portion (e.g. random data buffer exploits SLC blocks and the block-based-managed-space blocks are MLC and therefore have different reliability requirements) the below treatment is proposed.

It is assumed that this section is relevant when:
a. The impact of additional wear (e.g. P/E cycling) on the physical blocks free due to un-mapping and used for increasing overprovisioning (due to the described feature) presents no problem for the device.
b. Most of the overprovisioning space is managed in a different manner than most of the general space. E.g. most overprovisioning manages blocks as SLC buffer, while the general memory space is managed as MLC and the spare blocks are kept in separate pools most of the time in order not to mix up the blocks and their physical characteristics.

Memory controller 30 should be able to distinguish the blocks used to store random write traffic currently signed as spare as a result of un-mapping (e.g. originally MLC blocks used as SLC blocks in random data buffer). E.g. SW flag (indication) can be added per used block for that matter.

Memory controller 30 should be able to consume spare blocks originated in un-mapping process to be used both as general (block-based) storage blocks and as random write cache blocks. E.g. for the case of MLC and SLC blocks separation some amount of MLC blocks can be used as both SLC and MLC blocks as long as they will be freed to the MLC spare blocks pool.

Unmapped blocks (spare physical blocks originated in un-mapping process) should only be consumed for the sake of performance increasing (for storing random write cache data). E.g. memory controller 30 should not use such block for storing system/control information.

Typically it would be more efficient to use most of the native (not the unmapped ones) overprovisioning blocks before starting consuming the unmapped blocks (e.g. in order not to add wear on such blocks).

Mapping blocks due to incoming traffic claiming unmapped user space should be held up when the system needs to map a block and is not able to do so due to the need to free such block and until it is freed.

The memory controller 30 should be able to dynamically adjust the cleaning rate so it allows absorbing the incoming traffic in the random data cache until originally unmapped blocks are freed allowing writing directly to the general (block-based) storage portion.

For some systems, due to possible clustering of native overprovisioning blocks and unmapped blocks in the random data buffer, it may mean that random data cache may need to first free many native overprovisioning (e.g. SLC) blocks before freeing a single originally unmapped block (e.g. MLC). Such behavior can result in a suboptimal performance. Example of a technique that can be applied to overcome this issue is to allow the general storage temporary use native-overprovisioning blocks (e.g. SLC) which should then be switched back with the originally unmapped blocks (e.g. MLC) when these become free.

Figure 3:
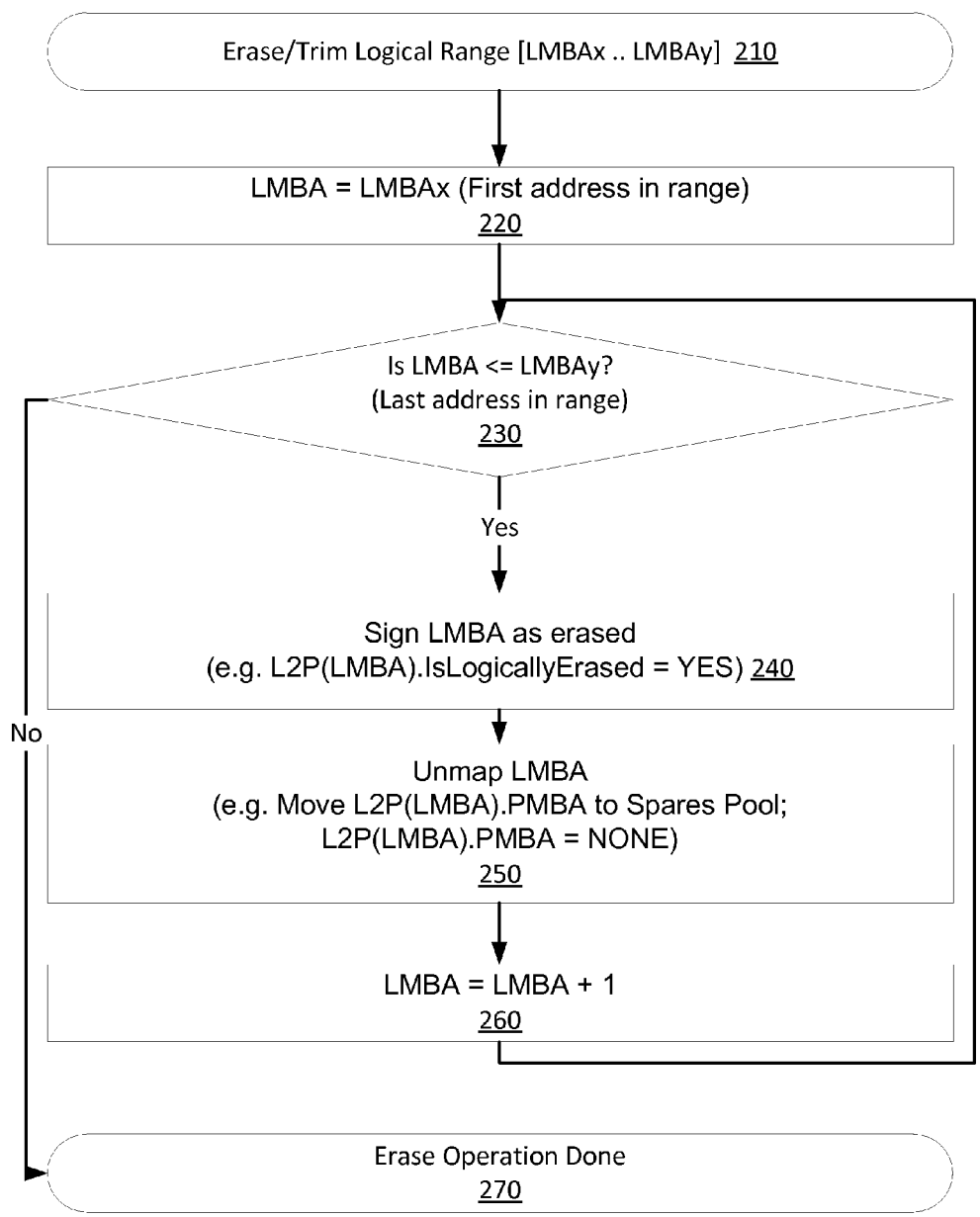
FIG. 3 illustrates a method according to an embodiment of the invention.

FIG. 3 illustrates method 200 for erasing or trimming a logical address space that includes multiple logical blocks according to an embodiment of the invention.

Method 200 starts by stage 210 of defining the erased or trimmed logical address space to range between LMBAx and LMBAy.

Stage 210 may be followed by stage 220 of starting to scan the logical blocks-variable LMBA is set to LMBAx (the first logical block in the logical address space).

Stage 220 may be followed by stage 230 of checking if all logical blocks were not already processed: Is LMBA<=LMBAy?

If yes (there are logical blocks to process)—jumping to stage 240 of tagging the physical block previously mapped to LMBA as logically erased (e.g. L2P (LMBA)·IsLogicallyErased=YES). This stage may also include tagging the LMBA as erased.

If no—jumping to stage 270 of

Stage 240 may be followed by stage 250 of un-mapping the physicla block (PMBA) that was previously mapped to LMBA. This involves allocating PMBA to the spare block pool and altering the logical to physical address to indicate that LMBA is not mapped to a physicla block—physical address=NONE.

Stage 250 may be followed by stage 260 of preparing to check the next logical block: LMBA=LMBA+1.

Stage 260 may be followed by stage 270 of ending the erasure process.

Figure 4:
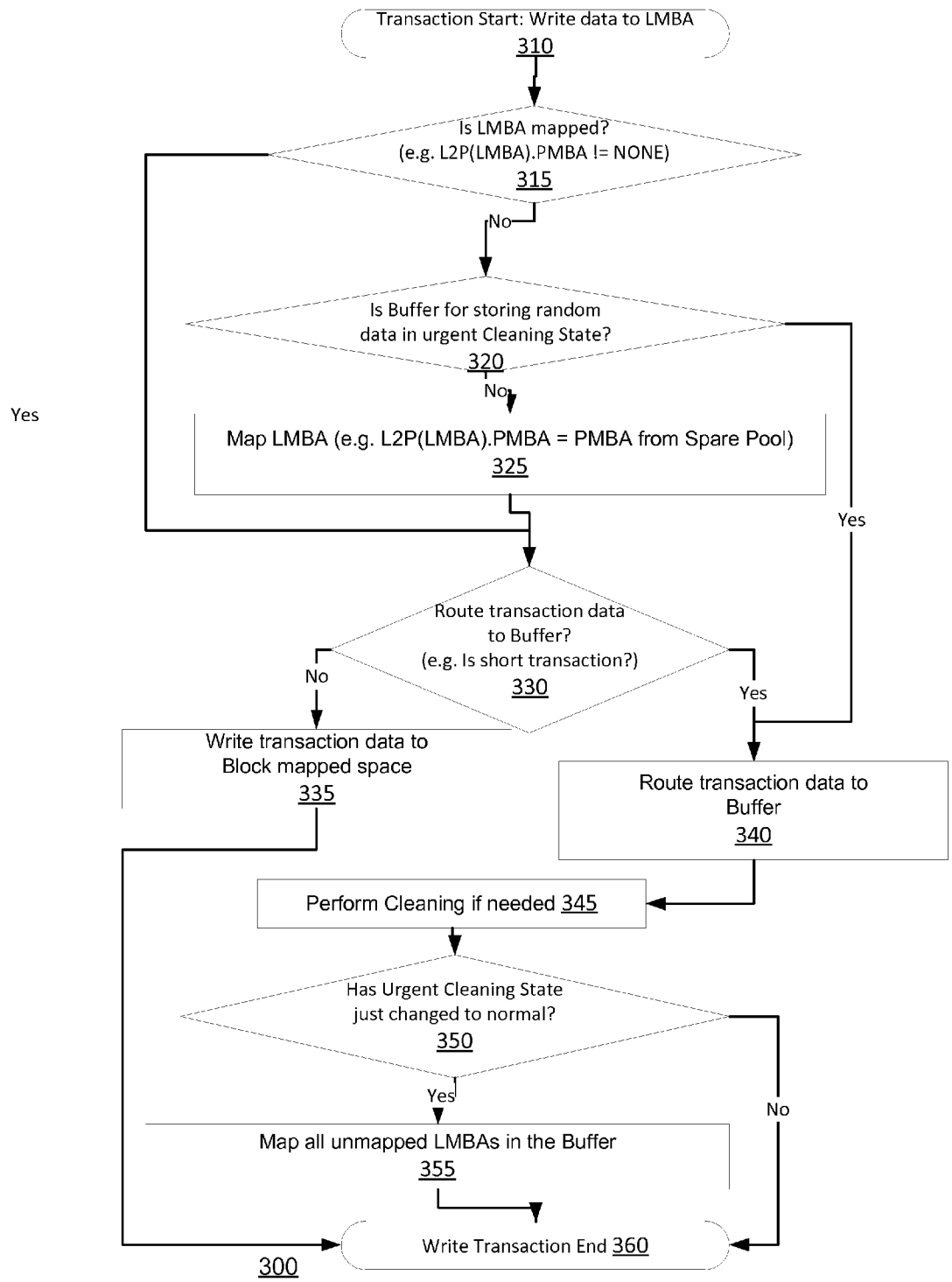
FIG. 4 illustrates a method according to an embodiment of the invention.

FIG. 4 illustrates method 300 according to an embodiment of the invention.

Method 300 illustrates an execution of a write transaction according to an embodiment of the invention.

Method 300 starts by stage 310 of transaction start by receiving a request to write data to a logical block LMBA.

Stage 310 may be followed by stage 315 of checking if the logica block LMBA is mapped to a physical block.

If no—jumping to stage 320 and if yes jumping to stage 330.

Stage 320 includes checking if the buffer (also referred to as data buffer 70) in an urgent cleaning state (thereby there is an urgent need to free buffer blocks of the buffer).

If no—jumping to stage 325 and if yes—jumping to stage 340.

If the buffer is not in an urgent cleaning an unmapped physical block PMBA from the spare block pool is allocated to LMBA—and LMBA is now mapped (stage 325) to the PMBA and the logical to physical DB 82 is updated accordingly: L2P(LMBA)·PMBA=PMBA from Spare Pool.

Stage 325 is followed by stage 330 of checking whether to route transaction data to the buffer. (denoted in FIG. 4 as "Is short transaction?"). Stage 330 may include, fore xample, writing short transactions (random writing) to the data buffer.

If no—jumping to stage 340 and if yes jumping to stage 335.

Stage 335 includes writing transaction data (associated with LMBA) to a block mapped space (the allocated PMBA from stage 325).

Stage 335 is followed by stage 360 of ending the write transaction.

Stage 340 includes routing transaction data to the buffer. The utilization of the buffer is done on a page to page basis.

Stage 340 is followed by stage 345 of performing cleaning operations if needed.

Stage 345 is followed by stage 350 of checking if the urgent state changed to normal state. If no—jumping to stage 360 and if yes jumping to stage 355.

Stage 355 may include mapping all unmapped LMBAs in the buffer.

Figure 6:
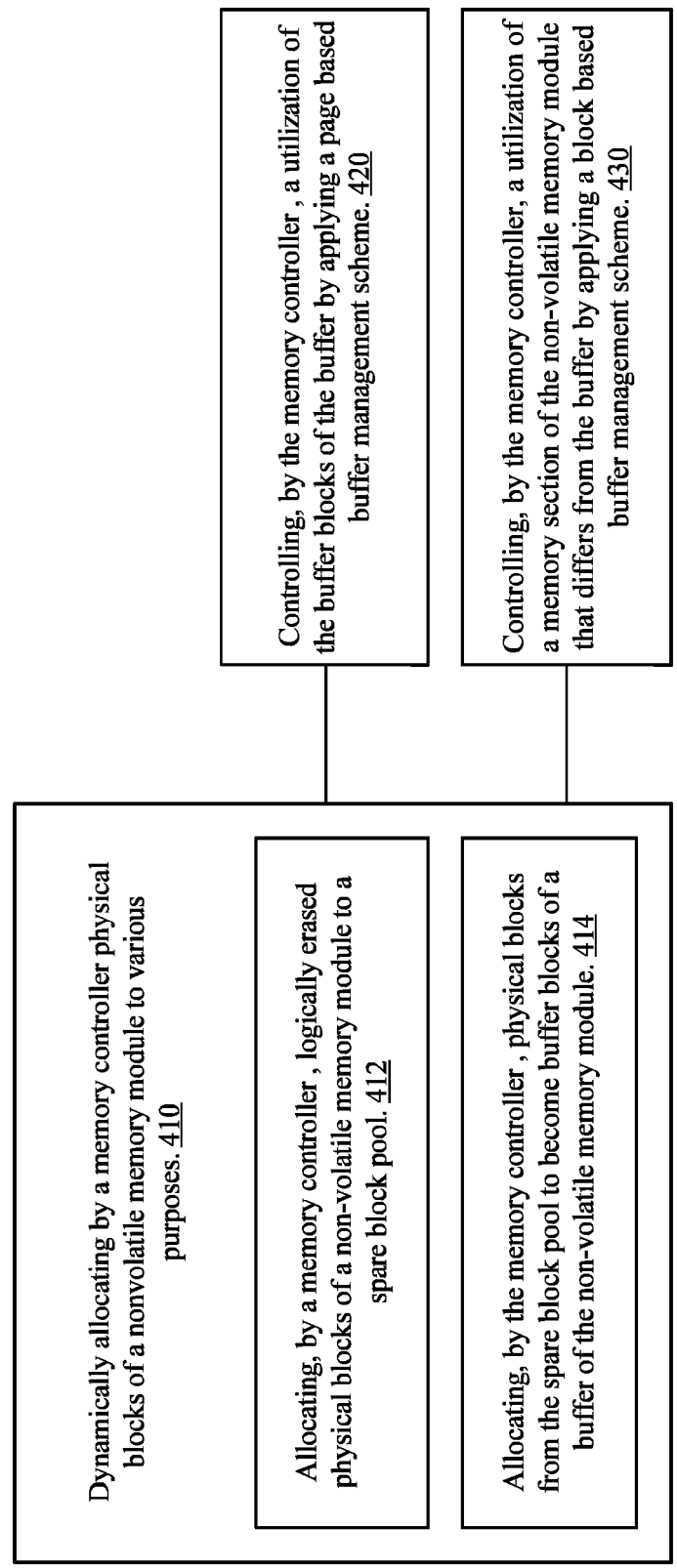
FIG. 6 illustrates a method according to an embodiment of the invention.

Accordingly—all LMBAs residing in the buffer at that point and which are unmapped (in the L2P DB) are mapped. FIG. 6 illustrates method 400 according to an embodiment of the invention.

Method 400 includes stage 410 of dynamically allocating by a memory controller physical blocks of a nonvolatile memory module to various purposes.

Stage 410 may include stage 412 of allocating, by a memory controller, logically erased physical blocks of a non-volatile memory module to a spare block pool and stage 414 of allocating, by the memory controller, physical blocks from the spare block pool to become buffer blocks of a buffer of the non-volatile memory module.

The allocation can change over time and physical blocks allocated to the spare block pool can be reallocated for other purposes—for being used as buffer blocks, for being allocated for sequential writing, and can be mapped and unmapped over time.

Stage 410 may be followed by stage 420 of controlling, by the memory controller, a utilization of the buffer blocks of the buffer by applying a page based buffer management scheme. The page based management scheme control the writing of data pages to the buffer blocks, reading data pages from the buffer blocks, cleaning data pages and merging data pages.

Stage 412 may include initially allocating (for example—after the memory controller is powered up) a predefined number of physical blocks to the spare block pool; and further allocating to the spare block pool additional logically erased physical blocks. Stage 420 may include controlling cleaning operations in response to a status of the buffer.

A cleaning operation may include writing data sectors (for example—data pages) that are associated with a same logical memory space portion and are stored in different buffer block to a target buffer block. Alternatively, a cleaning operation may include move all valid data from one physical space portion (old block) to another (new block).

Stage 420 may include receiving data pages to be written to the non-volatile memory module and determining whether to write the data pages to the buffer or to a mapped physical block. The determining may be responsive to a state of the buffer.

Stage 410 may also be followed by stage 430 of controlling, by the memory controller, a utilization of a memory section of the non-volatile memory module that differs from the buffer by applying a block based buffer management scheme. Stage 430 may include managing a logical block to physical block mapping data structure that maps logical blocks to mapped physical blocks.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method of managing a non-volatile memory module, the method comprising:
    allocating, by a memory controller, logically erased physical blocks of a non-volatile memory module to a spare block pool;
    allocating, by the memory controller, physical blocks from the spare block pool to become buffer blocks of a buffer of the non-volatile memory module; and
    controlling, by the memory controller, a utilization of the buffer blocks of the buffer by applying a page based buffer management scheme.

2. The method according to claim 1 wherein the allocating of the logically erased physical blocks comprises:
    initially allocating a predefined number of physical blocks to the spare block pool; and
    further allocating to the spare block pool additional logically erased physical blocks.

3. The method according to claim 1 wherein the controlling of the utilization of the buffer blocks comprises controlling cleaning operations in response to a status of the buffer.

4. The method according to claim 1 further comprising controlling, by the memory controller, a utilization of a memory section of the non-volatile memory module that differs from the buffer by applying a block based buffer management scheme.

5. The method according to claim 4 comprising managing a logical block to physical block mapping data structure that maps logical blocks to mapped physical blocks.

6. The method according to claim 4 comprising receiving data sectors to be written to the non-volatile memory module and determining whether to write the data sectors to the buffer or to a mapped physical block.

7. The method according to claim 6 wherein the determining is responsive to a state of the buffer.

8. The method according to claim 1 wherein the logically erased physical blocks comprise all logically erased physical blocks of the non-volatile memory module.

9. The method according to claim 1 wherein the logically erased physical blocks form only a part of all logically erased physical blocks of the non-volatile memory module.

10. The method according to claim 1 comprising allocating the logically erased physical blocks to multiple spare block pools, wherein different spare block pools are associated with different types of programming, wherein different types of programming differ from each other by a number of logical bits programmed per flash memory cell; and allocating, by the memory controller, physical blocks from the multiple spare block pools to become buffer blocks of the buffer of the non-volatile memory module.

11. The method according to claim 10 wherein the allocating of the physical blocks from the multiple spare block pools comprising independently managing the multiple spare block pools.

12. The method according to claim 1 further comprising allocating, by the memory controller, physical blocks that have become buffer blocks of a buffer of the non-volatile memory module to a sequential portion of the non-volatile memory module.

13. The method according to claim 1 further comprising allocating, by the memory controller, physical blocks from the spare block pool to a sequential portion of the non-volatile memory module.

14. A non-transitory computer readable medium that stores instructions that once executed by a memory controller cause the memory controller to:
allocate logically erased physical blocks of a non-volatile memory module to a spare block pool;
allocate physical blocks from the spare block pool to become buffer blocks of a buffer of the non-volatile memory module; and
control a utilization of the buffer blocks of the buffer by applying a page based buffer management scheme.

15. The non-transitory computer readable medium according to claim 14 that stores instructions that once executed by a memory controller cause the memory controller to initially allocate a predefined number of physical blocks to the spare block pool; and further allocate to the spare block pool additional logically erased physical blocks.

16. The non-transitory computer readable medium according to claim 14 that stores instructions that once executed by a memory controller cause the memory controller to control cleaning operations in response to a status of the buffer.

17. The non-transitory computer readable medium according to claim 14 that stores instructions that once executed by a memory controller cause the memory controller to control a utilization of a memory section of the non-volatile memory module that differs from the buffer by applying a block based buffer management scheme.

18. The non-transitory computer readable medium according to claim 17 that stores instructions that once executed by a memory controller cause the memory controller to manage a logical block to physical block mapping data structure that maps logical blocks to mapped physical blocks.

19. The non-transitory computer readable medium according to claim 14 that stores instructions that once executed by a memory controller cause the memory controller to receive data sectors to be written to the non-volatile memory module and determine whether to write the data sectors to the buffer or to a mapped physical block.

20. The non-transitory computer readable medium according to claim 19 that stores instructions that once executed by a memory controller cause the memory controller to determine in response to a state of the buffer.

21. A memory controller, comprising:
an allocation circuit that is arranged to allocate logically erased physical blocks of a non-volatile memory module to a spare block pool and to allocate physical blocks from the spare block pool to become buffer blocks of a buffer of the non-volatile memory module; and
a buffer memory controller that is arranged to control a utilization of the buffer blocks of the buffer by applying a page based buffer management scheme.

22. The memory controller according to claim 21 wherein the allocation circuit is arranged to initially allocate a predefined number of physical blocks to the spare block pool; and further allocate to the spare block pool additional logically erased physical blocks.

23. The memory controller according to claim 21 wherein the buffer memory controller is arranged to control cleaning operations in response to a status of the buffer.

24. The memory controller according to claim 21 comprising a block control circuit that is arranged to control a utilization of a memory section of the non-volatile memory module that differs from the buffer by applying a block based buffer management scheme.

25. The memory controller according to claim 24 that is arranged to manage a logical block to physical block mapping data structure that maps logical blocks to mapped physical blocks.

26. The memory controller according to claim 24 comprising an interface that is arranged to receive data sectors to be written to the non-volatile memory module and wherein the memory controller is arranged to determine whether to write the data sectors to the buffer of to a mapped physical block.

27. The memory controller according to claim 26 wherein the determining is responsive to a state of the buffer.

* * * * *